United States Patent
Hamada

[11] Patent Number: 6,090,645
[45] Date of Patent: Jul. 18, 2000

[54] FABRICATION METHOD OF SEMICONDUCTOR DEVICE WITH GETTERING TREATMENT

[75] Inventor: Koji Hamada, Tokyo, Japan

[73] Assignee: NEC Corporation, Tokyo, Japan

[21] Appl. No.: 09/015,667

[22] Filed: Jan. 29, 1998

[30] Foreign Application Priority Data

Jan. 29, 1997 [JP] Japan ................................. 9-015103

[51] Int. Cl.$^7$ ................... H01L 21/263; H01L 21/322; H01L 21/336
[52] U.S. Cl. ................... 438/143; 438/275; 438/471; 438/473; 438/795; 438/152; 438/310; 438/402
[58] Field of Search ................... 438/143, 471, 438/472, 473, 795, 275, 152, 310, 402

[56] References Cited

U.S. PATENT DOCUMENTS

| | | | |
|---|---|---|---|
| 4,548,654 | 10/1985 | Tobin | 438/471 |
| 4,597,804 | 7/1986 | Imaoka | 438/471 |
| 5,327,007 | 7/1994 | Imura et al. | 257/610 |
| 5,674,756 | 10/1997 | Satoh et al. | 438/471 |
| 5,757,063 | 5/1998 | Tomita et al. | 257/610 |
| 5,788,763 | 8/1998 | Hayashi et al. | 438/147 |

*Primary Examiner*—Mary Wilczewski
*Assistant Examiner*—Yung A. Lin
*Attorney, Agent, or Firm*—Young & Thompson

[57] ABSTRACT

A fabrication method of a semiconductor device capable of effective gettering treatment even when electronic elements are further miniaturized and further integrated and a semiconductor substrate or wafer is upsized. First, a single-crystal silicon substrate having a p-type gettering layer in its interior is prepared. Transistors are formed at the main surface of the substrate. An interlayer dielectric layer is formed to cover the transistors. Contact holes are formed in the interlayer dielectric layer to uncover specific positions of the respective transistors. The substrate is rapidly heated to a first temperature of 700° C. to 850° C. at a heating rate. The substrate is gradually cooled from the first temperature to a second temperature of approximately 600° C. at a cooling rate. Metallic wiring lines are formed on the interlayer dielectric layer to electrically connected to the respective transistors through the corresponding contact holes. The target metallic impurity existing in and entered into the interior of the substrate is trapped by the gettering layer during the gradual cooling step.

13 Claims, 11 Drawing Sheets

FABRICATION METHOD OF SEMICONDUCTOR DEVICE WITH GETTERING TREATMENT

BACKGROUND OF THE INVENTION

1. Field of the Invention

The present invention relates to a semiconductor device fabrication and more particularly, to a fabrication method of a semiconductor device, which is capable of effective gettering treatment during a fabrication process sequence with respect to miniaturized and integrated semiconductor devices using upsized semiconductor substrates or wafers.

2. Description of the Prior Art

In recent years, miniaturization and integration of semiconductor elements and upsizing of semiconductor substrates or wafers have been progressing more and more in the field of semiconductor devices. According to this tendency, the process temperature has been required to be lowered. Therefore, the need for improvement in gettering treatment has been becoming stronger.

Although the conventional Denuded-Zone Intrinsic Gettering (DZIG) treatment was effective for conventional high-temperature fabrication processes, it has been becoming unsuitable to the recent fabrication processes which are carried out at temperatures lower than 1000° C. This is because a desired gettering or trapping site is difficult to be formed at such the low temperatures.

Specifically, to form a controlled defect-free zone (i.e., "denuded zone") serving as a gettering or trapping site in the interior of a semiconductor wafer using the DZIG treatment, the wafer is essential to be subjected to high-temperature thermal processes performed at temperatures ranging from typically 1000° C. to 1200° C.

A known solution to the above need for gettering treatment improvement is the Polysilicon-Back-Sealing (PBS) method. This PBS method was been disclosed, for example, in the Japanese Non-Examined Patent Publication No. 5-275436 published in October 1993. In this method, a polysilicon film serving as a gettering site is deposited on the back side of a single-crystal silicon wafer or substrate, thereby forming a PBS wafer. Then, the PBS wafer is subjected to heat treatment under specific conditions.

The PBS method is a typical one of extrinsic gettering treatments.

FIGS. 1 and 2 illustrate the time-dependent temperature change in the gettering treatments using the PBS method disclosed in the Japanese Non-Examined Patent Publication No. 5-275436. In these Figures, the axis of abscissa represents the time in arbitrary unit.

In a first one of the conventional gettering treatments using the PBS method, as shown in FIG. 1, a PBS silicon wafer is heated in an electric furnace from a temperature of approximately 800° C. up to approximately 900° C. This heating process is carried out in the same way as that of popular electric-furnace heat treatments. Next, the PBS wafer is held at approximately 900° C. for a specific period. Then, it is gradually cooled to a temperature of 400 to 700° C. at a cooling rate of 3° C./min.

In a second one of the conventional gettering treatments using the PBS method, as shown in FIG. 2, a PBS silicon wafer is heated in an electric furnace from a temperature of approximately 800° C. up to approximately 900° C. This heating process is carried out in the same way as that of popular electric-furnace heat treatments. Next, the PBS wafer is held at approximately 900° C. for a specific period. Then, it is cooled to a temperature in the range of 400 to 700° C. and held at this temperature for a specific period.

In these two conventional gettering treatments, metallic impurities such as heavy metals (e.g., Fe) existing in the interior of the PBS wafer are gettered or trapped in the polysilicon film deposited on the back side of the wafer during the gradual cooling period from a temperature of 900° C. to another temperature of 400 to 700° C., or the holding period at the temperature of 400 to 700° C., respectively.

With these conventional gettering treatments, however, the following problems will occur if miniaturization and integration of semiconductor elements and upsizing of semiconductor substrates or wafers further progress.

First, the wafer upsizing increases the thickness of a silicon wafer itself. For example, a silicon wafer with a diameter of 6 inches needs to have a thickness of approximately 0.675 mm. In this case, to remove not only metallic impurities such as ferrum (Fe) which are inherent in the silicon wafer but also those which are doped into the wafer during subsequent fabrication processes using the PBS method, the latter impurities need to diffuse from the main surface of the wafer to the back side thereof.

For example, it is required for the 6-inch silicon wafer to be held at a temperature of approximately 900° C. for such a long period as 10 to 20 minutes. This holding period will be longer with the increasing diameter of the wafer.

Accordingly, the gradual cooling step from the temperature of approximately 900° C. to 400 to 700° C. at the cooling rate of −3° C./min and the holding step at the temperature of 400 to 700° C. for the specific period, both of which are disclosed in the Japanese Non-Examined Patent Publication No. 5-275436, are insufficient for the metallic impurities to be gettered. For example, the 6-inch wafer is essential to be held at 900° C. for a specific period.

Second, the progressing miniaturization and integration decreases the depth ($X_j$) of p-n junctions of heavily-doped diffusion regions formed at the main surface of a silicon wafer. For example, the depth ($X_j$) needs to be as small as approximately 0.1 μm for Metal-Oxide-Semiconductor Field-Effect Transistors (MOSFETs) fabricated at a design rule of 0.25 μm.

With $p^+$-type diffusion regions heavily doped with boron (B) and $n^+$-type diffusion regions heavily doped with phosphorus (P), both of which have a doping concentration of $10^{19}$ to $10^{20}$ atoms/cm$^3$, it is known that the dopant atoms will diffuse at an increased diffusion rate. This phenomenon is termed the "enhanced diffusion".

Therefore, for example, with a p-channel MOSFET having $p^+$-type diffusion regions heavily doped with boron, which has the p-n junction depth ($X_j$) of approximately 0.1 μm and which is fabricated through ion-implantation of boron difluoride (BF$_2$) with a dose of 5×10$^{15}$ atoms/cm$^2$ at an acceleration energy of 30 keV and rapid thermal annealing (RTA) at a temperature of 950° C. for 10 seconds, there is a problem explained below.

Specifically, if this MOSFET is subjected to a gettering treatment at 900° C. for 10 minutes, operation characteristics of the MOSFET tend to degrade. For example, the "short channel effect" tends to occur. This is because the heat treatment at 900° C. for 10 minutes increases the p-n junction depth ($X_j$) by approximately 0.05 μm.

The same degradation in operation characteristics takes place in the other MOSFETs having $n^+$-type diffusion regions, which are heavily doped with phosphorus.

The same degradation in operation characteristics takes place in npn-type bipolar transistors, also. In the bipolar transistors, leakage current increase between a p⁺-type graft base region and an n⁺-type emitter region tends to occur.

As described above, the conventional gettering treatments are unable to cope with the progressing miniaturization and integration of semiconductor elements and upsizing of semiconductor substrates or wafers.

Moreover, with a MOSFET having the self-aligned silicide (SALICIDE) structure where titanium suicide ($TiSi_2$) films are respectively deposited on the top surfaces of heavily-doped diffusion regions (i.e., source/drain regions) and a gate electrode in self-alignment, aggregation of $TiSi_2$ tends to occur if this MOSFET is subjected to heat treatment at a temperature of 850° C. or higher after the formation of the SALICIDE structure. This aggregation causes a problem of increase in sheet resistance of the gate electrode.

This problem is more distinctive in the top surface of the gate electrode than the source/drain regions.

Consequently, the above-described conventional gettering treatments are not suitable to the MOSFETs having the SALICIDE structure.

SUMMARY OF THE INVENTION

Accordingly, an object of the present invention is to provide a fabrication method of a semiconductor device that is capable of effective gettering treatment even when semiconductor elements are further miniaturized and further integrated and a semiconductor substrate or wafer is upsized.

Another object of the present invention is to provide a fabrication method of a semiconductor device that is capable of effective gettering treatment to MOSFETs with the SALICIDE structure.

Still another object of the present invention is to provide a fabrication method of a semiconductor device that is capable of gettering treatment during a fabrication process sequence.

The above objects together with others not specifically mentioned will become clear to those skilled in the art from the following description.

According to a first aspect of the present invention, a fabrication method of a semiconductor device is provided. This method is comprised of the following steps (a) to (g).
(a) A single-crystal silicon substrate having a gettering layer in its interior is prepared. The gettering layer is located at a specific depth from a main surface of the substrate.
(b) Transistors are formed at the main surface of the substrate.
(c) An interlayer dielectric layer is formed to cover the transistors.
(d) Contact holes are formed in the interlayer dielectric layer to uncover specific positions of the respective transistors.
(e) The substrate is rapidly heated to a first temperature of 700° C. to 850° C. at a heating rate after the step (d).
(f) The substrate is gradually cooled from the first temperature to a second temperature of approximately 600° C. at a cooling rate. This cooling step (f) is promptly started without holding the substrate at the first temperature.
(g) Metallic wiring lines are formed on the interlayer dielectric layer to electrically connected to the respective transistors through the corresponding contact holes after the step (f).

The depth of the gettering layer is less than a diffusible distance of a target metallic impurity during the step (f), allowing the target metallic impurity to diffuse into the gettering layer.

The target metallic impurity existing in and entered into the interior of the substrate is trapped by the gettering layer during the step (f).

With the fabrication method of a semiconductor device according to the first aspect of the present invention, the gettering layer is provided in the interior of the silicon substrate in the step (a) in advance. Then, the substrate is rapidly heated to the first temperature at the heating rate in the step (e), and it is gradually cooled from the first temperature to the second temperature at the cooling rate in the step (f).

The target metallic impurity existing in the interior of the substrate becomes soluble and has a comparatively high diffusion coefficient after the rapid heating step (e). Therefore, it seems that the target metallic impurity is stably dissolved in the interior of the substrate. The dissolved impurity in the substrate tends to diffuse into a site with a higher solid solubility with respect to the impurity, i.e., the gettering layer.

Since the depth of the gettering layer is less than the diffusible distance of the target metallic impurity during the gradual cooling step (f), the dissolved impurity is able to reach the gettering layer during this step (f).

On the other hand, during the gradual cooling step (f), the dissolved target impurity has an increasing tendency to segregate in the interior of the substrate according to the temperature lowering. Consequently, the dissolved impurity segregates in the gettering layer after the step (f). This means that the target impurity is effectively trapped by the gettering layer.

As a result, effective gettering treatment is able to be performed even when semiconductor elements are further miniaturized and further integrated and a semiconductor substrate or wafer is upsized.

Also, the first temperature in the rapid heating step (e) is in the range of 700° C. to 850° C., and this step (e) is performed after the contact-hole formation step (d). Therefore, the rapid heating step (e) and the gradual cooling step (f) may be located near the end of the fabrication process sequence of a semiconductor device.

Thus, gettering treatment is able to be carried out during a fabrication process sequence of a semiconductor device.

In the method according to the first aspect, the gettering layer may be readily formed by any process such as ion implantation.

The silicon substrate may be of an n- or p-type. If it is of a p-type, the doping concentration of the gettering layer needs to be higher than the substrate itself; i.e., the gettering layer needs to be of a p⁺-type. This is to ensure a higher solid solubility of the gettering layer with respect to the target impurity than the substrate itself.

The target metallic impurity is, for example, heavy metals such as Fe, Cu, Al, and so on.

The upper limit of the first temperature in the step (e) is 850° C. This is to suppress the enhanced diffusion of the target metallic impurity.

However, if the transistors include at least one MOSFET with a SALICIDE structure, the upper limit of the first temperature needs to set as 800° C. This is to suppress aggregation of a silicide compound of a refractory metal, which is used for forming the SALICIDE structure. In this case, there is an additional advantage effective gettering treatment to MOSFETs with the SALICIDE structure is able to be performed.

The lower limit of the first temperature is 700° C. This is to ensure the dissolution of the target metallic impurity from silicon lattices and the diffusion thereof in the interior of the substrate, which is from the viewpoint in practical use.

It is preferred that the heating rate in the step (e) is 50° C./sec or higher. If it is lower than 50° C./sec, the substrate and a structure formed thereon is subjected to high temperatures for an excessively long period, resulting in degradation in electrical characteristics of the transistors through enhanced diffusion or aggregation of the refractory metal-silicide compound.

The gradual cooling step (f) is promptly started without holding the substrate at the first temperature. If this step is not promptly started, the significance of the rapid heating in the step (e) becomes invalid.

It is preferred that the cooling rate in the step (f) is in the range from 1° C./min to 100° C./min. If it is lower than 1° C./min, the heat-treatment period becomes excessively long and the fabrication cost becomes high. If it is higher than 100° C./min, the diffusion of the target metallic impurity is suppressed, preventing the target impurity from diffusing into the gettering layer. This will degrades the electrical characteristics of the transistors.

It is more preferred that the cooling rate in the step (f) is in the range from 3° C./min to 10° C./min. If it is in this range, a wanted gettering effect can be given without any problems about the heat-treatment time from the viewpoint of practical use.

According to a second aspect of the present invention, another fabrication method of a semiconductor device is provided, which is comprised of the following steps (a) to (g).

(a) A first single-crystal silicon epitaxial layer is formed on or over a main surface of a p-type single-crystal silicon substrate.

(b) Transistors are formed at the main surface of the first epitaxial layer.

(c) An interlayer dielectric layer is formed to cover the transistors.

(d) Contact holes are formed in the interlayer dielectric layer to uncover specific positions of the respective transistors.

(e) The substrate and the first epitaxial layer are rapidly heated to a first temperature of 700° C. to 850° C. at a heating rate after the step (d).

(f) The substrate and the first epitaxial layer are gradually cooled from the first temperature to a second temperature of approximately 600° C. at a cooling rate. This cooling step (f) is promptly started without holding the substrate and the first epitaxial layer at the first temperature.

(g) Metallic wiring lines are formed on the interlayer dielectric layer to electrically connected to the respective transistors through the corresponding contact holes after the step (f).

The distance from a main surface of the first epitaxial layer to a main surface of the substrate is less than a diffusible distance of a target metallic impurity during the step (f), allowing the target metallic impurity to diffuse into the substrate.

The target metallic impurity existing in and entered into the interior of the first epitaxial layer is trapped by the substrate during the step (f).

With the fabrication method of a semiconductor device according to the second aspect of the present invention, the first epitaxial layer is provided as a gettering site. The transistors are formed at the main surface of the first epitaxial layer.

Therefore, because of the same reason as in the method according to the first aspect, there are the same advantages as those in the method according to the first aspect.

In the method according to the second aspect, the substrate and the first epitaxial layer may be of an n- or p-type. However, the substrate is preferably of a p-type, because it serves as a gettering site.

If the substrate and the first epitaxial layer are of a p-type, the doping concentration of the substrate needs to be higher than the substrate. This is to ensure a higher solid solubility of the substrate with respect to the target impurity than the first epitaxial layer.

The target metallic impurity is, for example, heavy metals such as Fe, Cu, Al, and so on.

The upper and lower limits of the first temperature in the step (e) are the same as in the method according to the first aspect.

If the transistors includes at least one MOSFET with a SALICIDE structure, the upper limit of the first temperature needs to set as 800° C. because of the same reason as in the method according to the first aspect. In this case, there is an additional advantage effective gettering treatment to MOSFETs with the SALICIDE structure is able to be performed.

It is preferred that the heating rate in the step (e) is 50° C./sec or higher because of the same reason as in the method according to the first aspect.

The gradual cooling step (f) is promptly started without holding the substrate at the first temperature. The reason of this is the same as in the method according to the first aspect.

It is preferred that the cooling rate in the step (f) is in the range from 1° C./min to 100° C./min because of the same reason as in the method according to the first aspect.

It is more preferred that the cooling rate in the step (f) is in the range from 3° C./min to 10° C./min because of the same reason as in the method according to the first aspect.

It is preferred that a step (h) of forming a second single-crystal silicon epitaxial layer is further provided between the steps (a) and (b). The second epitaxial layer is located on the main surface of the substrate and the first epitaxial layer is located on the second epitaxial layer.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
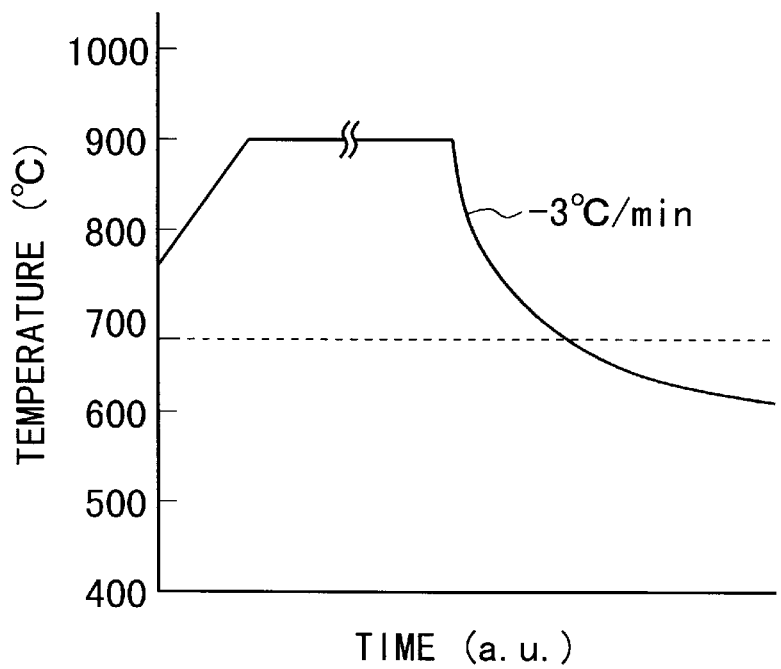
FIG. 1 is a graph showing the temperature change with respect to the time in a conventional fabrication method of a semiconductor device.
Figure 2:
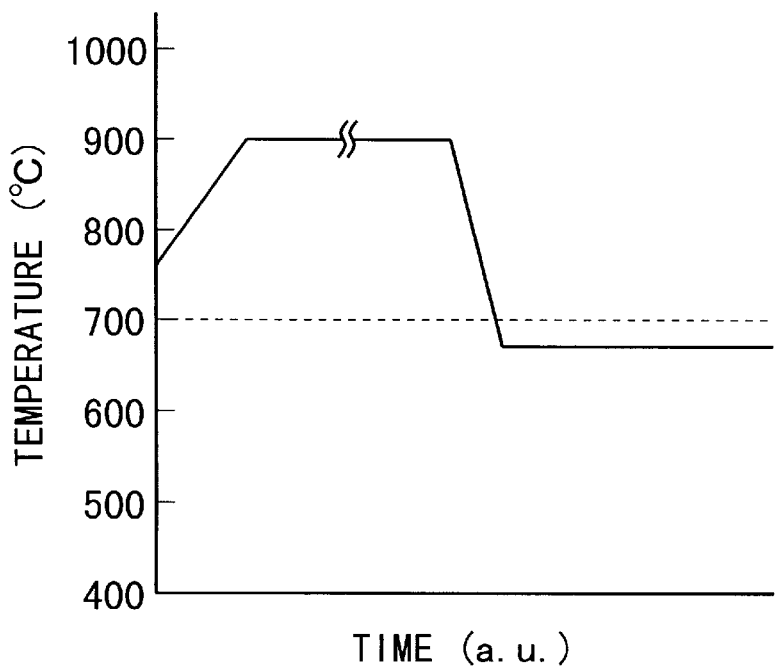
FIG. 2 is a graph showing the temperature change with respect to the time in another conventional fabrication method of a semiconductor device.

Preferred embodiments of the present invention will be described below referring to the drawings attached.

First Embodiment

Figure 3A:
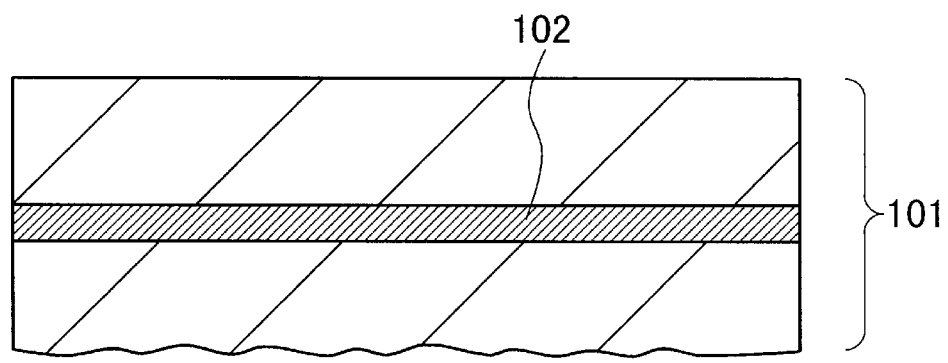
FIGS. 3A to 3D are partial cross-sectional views showing a fabrication method of a semiconductor device according to a first embodiment of the present invention, respectively.

In a fabrication method of a semiconductor device according to a first embodiment of the invention, first, a p-type single-crystal silicon substrate or wafer 101 is prepared, as shown in FIG. 3A.

Practically, a lot of MOSFETs will be formed on this substrate or wafer 101. However, only one of the MOSFETs is explained here for the sake of simplification of description.

Next, boron (B) is ion-implanted into the substrate 101 at a high acceleration energy of 3 MeV with a dose of $1\times10^{15}$ atoms/cm$^2$. Then, the substrate 101 is subjected to an RTA process at a peak temperature of 1000° C. for 30 minutes, where the heating rate is 100° C./sec. Thus, a p$^+$-type gettering layer 102 is formed at a depth of approximately 4 μm from the main surface of the substrate 101, as shown in FIG. 3A. The gettering layer 102 is parallel to the main surface of the substrate 101.

Next, a field oxide layer 106 is selectively formed on the main surface of the substrate 101 using a LOCal Oxidation of Silicon (LOCOS) method, defining an active region. An n-type well 107 is then formed at the main surface of the substrate 101 in the active region. A gate oxide layer 108 is selectively formed on the main surface of the substrate 101 in the well 107. A gate electrode 109 is formed on the gate oxide layer 108. A silicon dioxide (SiO$_2$) layer (not shown) is deposited over the whole substrate 101 to cover the gate electrode 109 by a Chemical Vapor Deposition (CVD) method. The SiO$_2$ layer is etched back to thereby form a pair of sidewall spacers 110 on the gate oxide layer 108 at each side of the gate electrode 109.

Figure 3B:
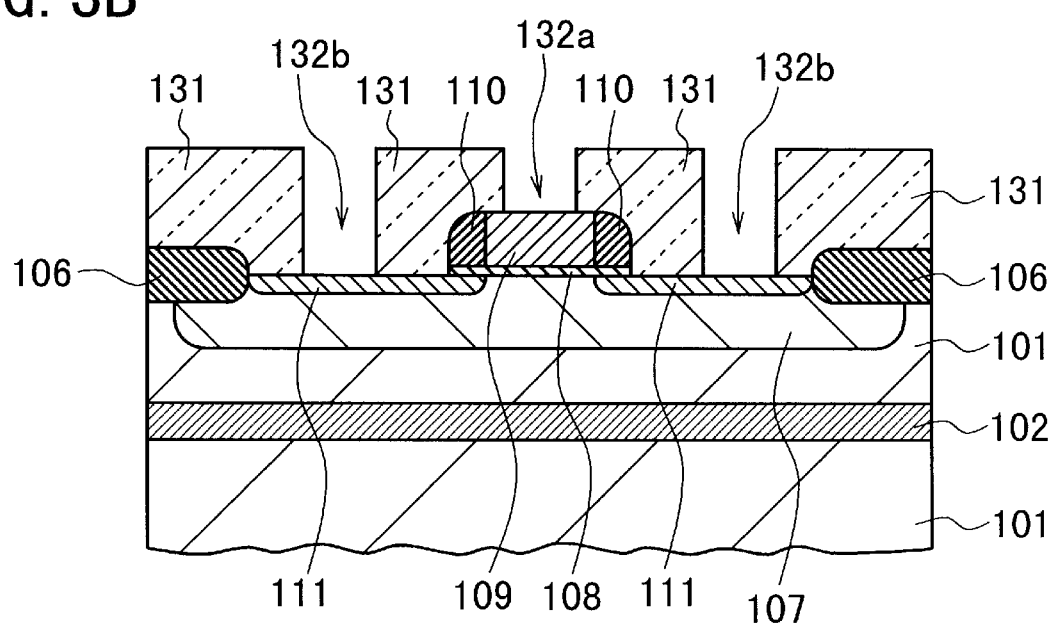

Subsequently, boron difluoride (BF$_2$) is selectively ion-implanted into the well 107 at an acceleration energy of 30 keV with a dose of $2\times10^{15}$ atoms/cm$^2$ using the gate electrode 109 and the pair of sidewall spacers 110 as a mask. Then, the substrate 101 is subjected to an RTA process at a temperature of 950° C. for 10 seconds. Thus, a pair of p$^+$-type source/drain regions 111 are formed in the n-type well 107, as shown in FIG. 3B. The pair of source/drain regions 111 have a same p-n junction depth ($X_j$) of approximately 0.1 μm from the main surface of the substrate 101.

Following this, an interlayer dielectric layer 131 made of a SiO$_2$-system material is deposited to cover the gate electrode 108, the pair of sidewall spacers 110, the field oxide layer 106, and the uncovered surface of the well 107 over the whole substrate 101. A contact hole 132a reaching the top of the gate electrode 108 and a pair of contact holes 132b each reaching the surface of the well 107 are formed in the interlayer dielectric layer 131. The state at this stage is shown in FIG. 3B.

Further, using a popular RTA system, the substrate 101 with the above-described device structure formed thereon is rapidly heated up to 850° C. at a heating rate of 100° C./sec, and then, it is gradually cooled down to approximately 600° C. at a cooling rate of 10° C./min. This gradual cooling step is promptly started without holding the substrate 101 and the device structure at the peak temperature of 850° C.

Through this thermal processes, a gettering treatment is performed. This gettering treatment has a temperature profile as shown in FIG. 4 with respect to time.

Figure 4:
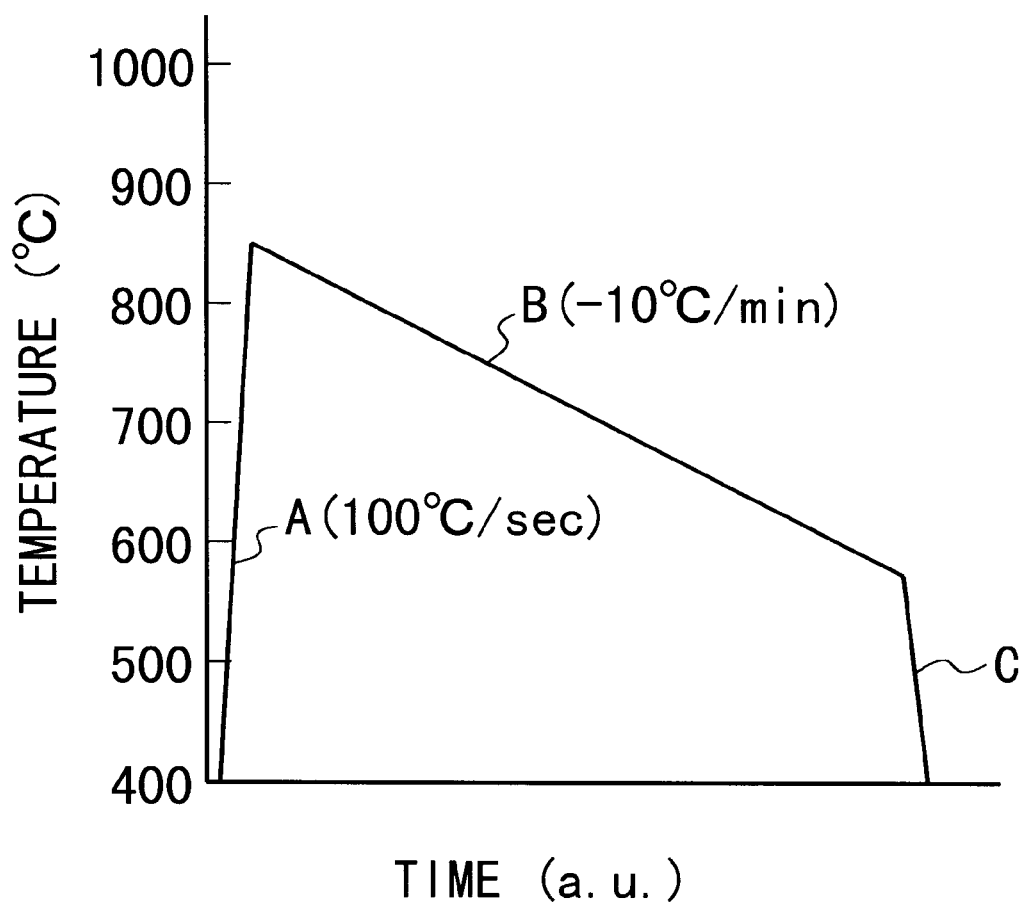
FIG. 4 is a graph showing the temperature change with respect to the time in the fabrication method of a semiconductor device according to the first embodiment of the present invention.

In FIG. 4, the line A represents the rapid heating step, the line B represents the gradual cooling step, and the line C represents a native cooling step. The axis of abscissa represents the time in arbitrary unit.

Figure 3C:
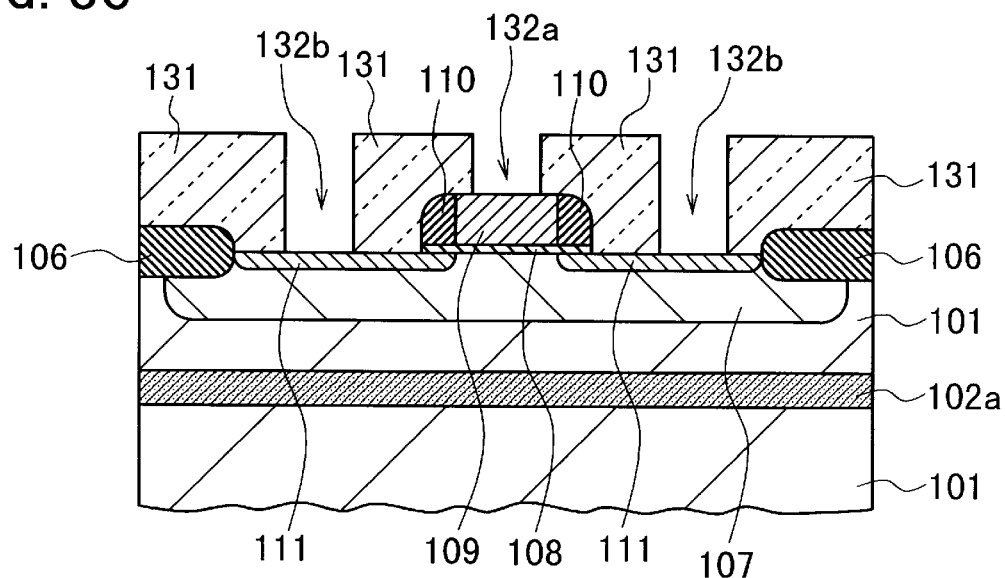

During this gettering treatment, metallic impurities existing in the interior of the p-type silicon substrate 101 are effectively trapped by the p$^+$-type gettering layer 102. The gettering layer 102 in which the metallic impurities are trapped is illustrated as a symbol 102a in FIG. 3C.

No process at a higher temperature than 850° C. is performed in the following steps. Therefore, the trapped metallic impurities by the gettering layer 102 are difficult to be dissolved.

Figure 3D:
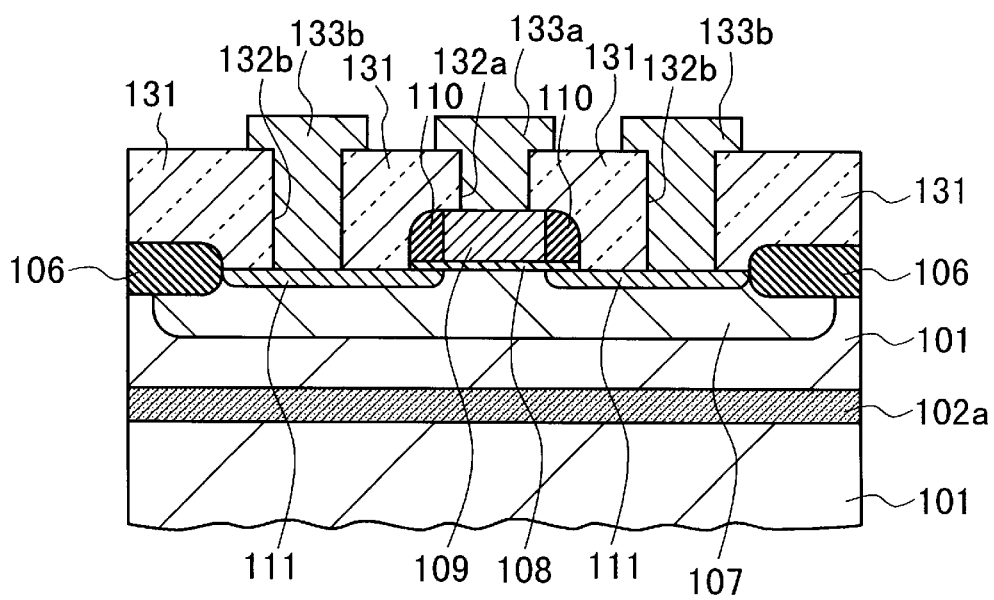

Finally, a metallic wiring line 133a for the gate electrode 108 and a pair of metallic wiring lines 133 for the source/drain regions 111 are formed on the interlayer dielectric layer 131, as shown in FIG. 3D. Thus, the wiring line 133a is contacted with and electrically connected to the gate electrode 109 through the corresponding contact hole 132a. The pair of wiring lines 133b are contacted with and electrically connected to the pair of source/drain regions 111 through the corresponding contact holes 132b, respectively.

Assuming that a target metallic element or impurity to be removed by the gettering process is Fe, which has a comparatively low diffusion coefficient, the solid solubility of Fe is as high as approximately $9.5\times10^{12}$ cm$^{-3}$ at a temperature of 850° C. Therefore, it is supposed that Fe atoms are stably dissolved in the interior of the p-type silicon substrate 101 at the temperature of 850° C.

Because the substrate 101 is promptly subjected to the subsequent gradual cooling step without holding it at 850° C., it may be assumed that the effect by this gettering process is equivalent to that by a heat treatment at a constant temperature of 800° C. for 5 minutes. Under this assumption, the diffusion coefficient of Fe is calculated as $6\times10^{-7}$ cm$^2$/sec. Therefore, the Fe atoms will diffuse for a distance of approximately 0.432 mm during this gettering process, which is longer than the depth of the gettering layer 102 from the main surface of the substrate 101 and which is shorter than the thickness of the substrate 101.

Therefore, not only Fe atoms existing in the interior of the p-type substrate 101 (including the p$^+$-type source/drain regions 111) but also those entered through the main surface of the substrate 101 are able to diffuse into the gettering layer 102, and they are trapped therein. Also, since the p-n junction depth $X_j$ of the pair of p$^+$-type source/drain regions 111 scarcely increases through this gettering treatment, the electric operation characteristics of the p-channel MOSFET is able to be readily suppressed.

The gettering action with respect to Fe atoms existing in the n-type well 107 is very weak.

The peak temperature during this gettering treatment process is not limited to 850° C. It may be set at any value in the range from 700° C. to 850° C. For example, when the peak temperature during this gettering treatment is set as 700° C., Fe atoms will diffuse for a distance of at least approximately 10 μm through the gradual cooling step of this gettering treatment. Accordingly, the gettering action is sufficiently given even at this lowest temperature.

Although the p-channel MOSFET is formed at the surface of the n-type well 107 in the first embodiment, it may be formed at the main surface of an n-type single-crystal silicon substrate. The method according to the first embodiment may be applied to a semiconductor device with an n-channel MOSFET or Complementary MOSFETS.

If a MOSFET has a SALICIDE structure, it is preferred that the temperature of the gettering treatment is limited to the range of 700° C. to 800° C.

Second Embodiment

FIGS. 5A to 5E show a fabrication method of a semiconductor device according to a second embodiment of the present invention. In this second embodiment, a bipolar transistor is formed on a silicon substrate using a Super Self-aligned Technology (SST) instead of a MOSFET.

Figure 5A:
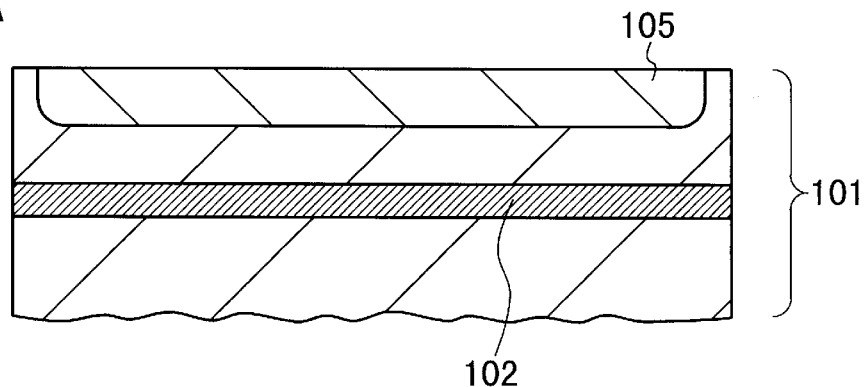
FIGS. 5A to 5E are partial cross-sectional views showing a fabrication method of a semiconductor device according to a second embodiment of the present invention, respectively.

First, a p-type single-crystal silicon substrate or wafer 101 is prepared, as shown in FIG. 5A.

Although a lot of bipolar transistors are formed on the substrate 101, only one of the transistors is shown here for the sake of simplification of description.

Next, boron (B) is ion-implanted into the substrate at a high acceleration energy of 3 MeV with a dose of $1 \times 10^{15}$ atoms/cm$^2$. Then, the substrate 101 is subjected to an RTA process under the same condition as that of the first embodiment. Thus, a p$^+$-type gettering layer 102 is formed at a depth of approximately 4 μm from the main surface of the substrate 101, as shown in FIG. 5A. The gettering layer 102 is parallel to the main surface of the substrate 101.

Then, phosphorus (P) is selectively ion-implanted into the substrate 101 at an acceleration energy of 0.7 MeV with a dose of $5 \times 10^{13}$ atoms/cm$^2$. Thus, an n-type collector region 105 is formed. Because the collector region 105 has a p-n junction depth ($X_j$) of approximately 0.8 μm, it is not contacted with the underlying gettering layer 102. This means that no effect is applied to the collector region 105 by the gettering layer 102. The state at this stage is shown in FIG. 5A.

Next, a field oxide layer 106 is selectively formed on the main surface of the substrate 101 using a LOCOS method, defining an active region to include the collector region 105.

The above formation process of the collector region 105 may be performed under the same ion-implantation condition as above after the LOCOS process for the field oxide layer 106. In this case, however, an RTA process may be added after this ion-implantation process, where the substrate 101 is heated at a heating rate of 100° C./sec and then, is held at 1000° C. for 30 seconds.

Further, a first SiO$_2$ layer 115 with a thickness of several tens nanometers is selectively formed on the uncovered area of the main surface of the substrate 101 by thermal oxidation. Then, phosphorus is selectively ion-implanted into the substrate 101 using a patterned photoresist film (not shown) a mask, thereby forming an n$^+$-type collector contact region 116. This n$^+$-type collector contact region 116 is contacted with and electrically connected to the n-type collector region 105. The junction depth ($X_j$) of the collector contact region 116 is set as a value not to be contacted with the gettering layer 102.

Following this, the first SiO$_2$ layer 115 is selectively removed at a predetermined base-formation area, thereby forming a base window in the layer 115. Then, boron difluoride (BF$_2$) is ion-implanted into the substrate 101 through this window at an acceleration energy of 30 keV with a dose of $1 \times 10^{14}$ atoms/cm$^2$, thereby forming a p-type base region 117 in the collector region 105.

Next, t p$^+$-type polysilicon layer (not shown) and a second SiO$_2$ layer 119 are successively deposited to cover the whole main surface of the substrate 101 by a CVD method. The polysilicon layer and the second SiO$_2$ layer 119 are successively patterned by anisotropic etching. Thus, a base contact region 118 is formed by the remaining polysilicon layer. The remaining second SiO$_2$ layer 119 is located on the base contact region 118.

Further, a third SiO$_2$ layer (not shown) with a thickness of 150 nm is deposited to cover the whole main surface of the substrate 101 by a CVD method. The third SiO$_2$ layer is etched back by anisotropic etching, thereby forming a pair of sidewall spacers 120 at the inside and outside of the base connection region 118. The pair of sidewall spacers 120 cover the inside and outside faces of the remaining second SiO$_2$ layer 119 also.

An undoped polysilicon layer with a thickness of 200 nm is then formed to cover the whole main surface of the substrate 101. Boron is ion-implanted into the undoped polysilicon layer thus formed at an acceleration energy of 70 keV with a dose of $1 \times 10^{16}$ atoms/cm$^2$. The boron-implanted polysilicon layer is patterned, to a predetermined shape of an emitter electrode. The patterned polysilicon layer then is subjected to an RTA process at 1000° C. for 10 seconds. Thus, the conductivity type of the patterned polysilicon layer is turned to the n$^+$ type, resulting in an n$^+$-type emitter electrode 123.

Figure 5B:
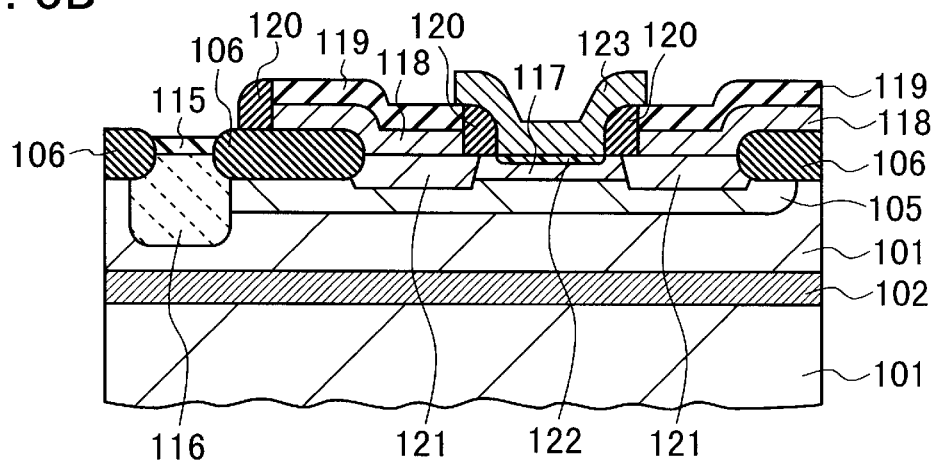

At the same time as this step, the boron doped into the base contact region 118 is thermally diffused into the substrate 101 to thereby form a p$^+$-type graft base region 121. The phosphorus doped into the emitter electrode 123 is thermally diffused into the substrate 101 to thereby form an n$^+$-type emitter region 122. The p$^+$-type graft base region 121 has a p-n junction depth of approximately 100 nm. The n$^+$-type emitter region 122 has a p-n junction depth of approximately 50 nm. The state at this stage is shown in FIG. 5B.

Figure 5C:
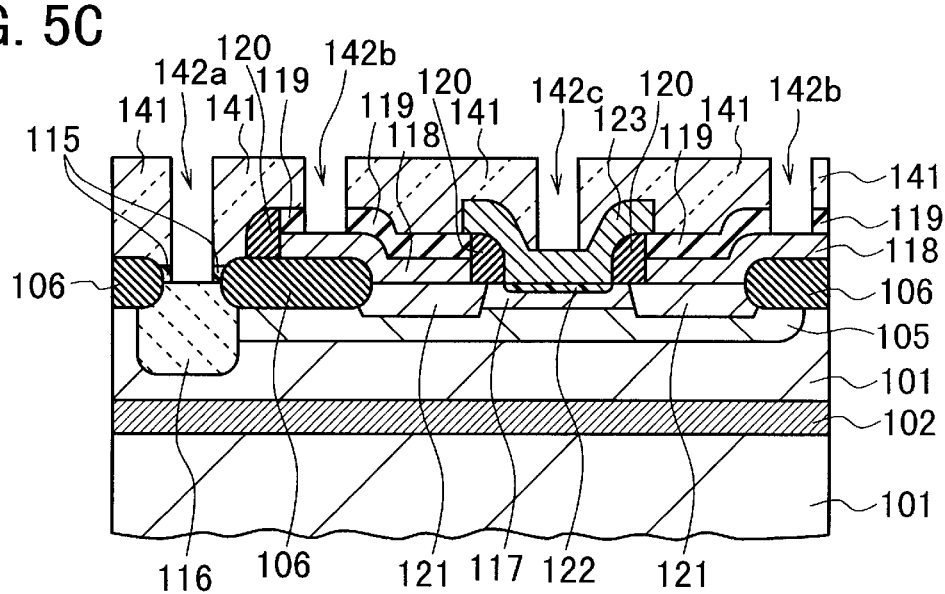
Figure 5D:
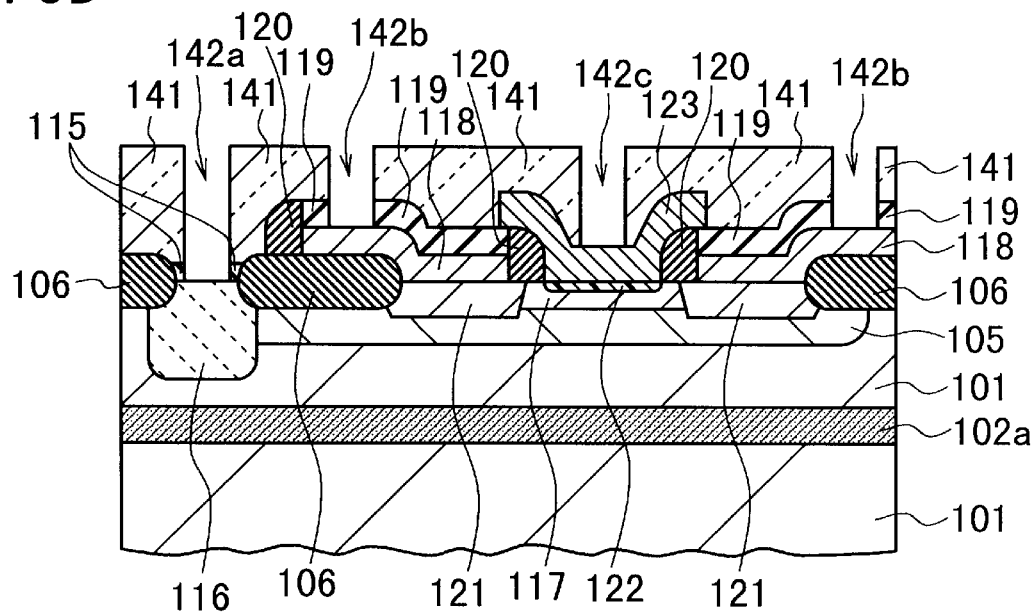

Following this step, an interlayer dielectric layer 141 made of a SiO$_2$-system material is deposited to cover the whole main surface of the substrate 101. A contact hole 142a reaching the top of the collector contact region 116, a contact hole 142b reaching the top of the base contact region 119, a contact hole 142c reaching the top of the emitter electrode 123 are formed in the interlayer dielectric layer 141. The state at this stage is shown in FIG. 5C.

The contact hole 142a penetrates the interlayer dielectric layer 141 and the SiO$_2$ layer 115. The contact holes 142b and 142c penetrate the interlayer dielectric layer 141 alone.

Further, using an RTA system, the substrate 101 with the above-described device structure formed thereon is rapidly heated up to 850° C. at a heating rate of 100° C./sec, and then, it is gradually cooled down to approximately 600° C. at a cooling rate of 10° C./min. These steps are the same as those in the first embodiment. Through this thermal process, a gettering treatment is performed. This gettering treatment has the same temperature profile as shown in FIG. 4.

During this gettering treatment, metallic impurities existing in the interior of the p-type silicon substrate 101 are effectively trapped by the underlying p$^+$-type gettering layer 102. The gettering layer 102 in which the metallic impurities are trapped is illustrated as a symbol 102a in FIG. 5D.

No process at a higher temperature than 850° C. is performed later. Therefore, the trapped metallic impurities by the gettering layer 102 are difficult to be dissolved. Also, because the junction depth ($X_j$) of the p$^+$-type graft base region 121 scarcely increases during this gettering treatment, leakage current between the p$^+$-type graft base region 121 and the n$^+$-type emitter region 122 is effectively and readily suppressed.

Figure 5E:
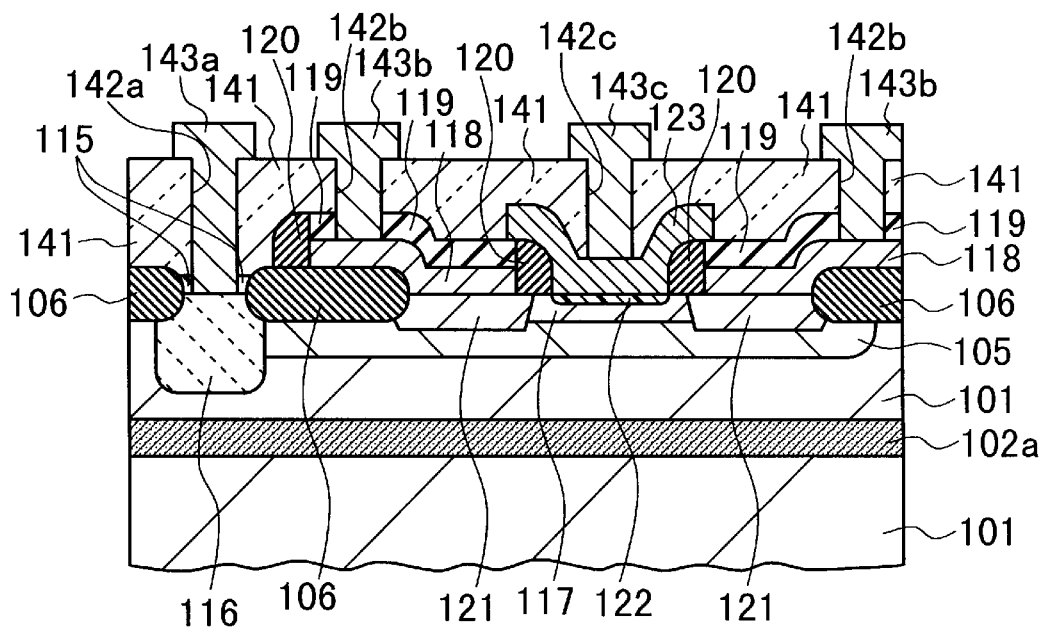

Finally, a metallic wiring line 143a for the n$^+$-type collector contact region 116, a metallic wiring line 143b for the base connection region 118, and a metallic wiring line 143c for the emitter electrode 123 are formed on the interlayer dielectric layer 141, as shown in FIG. 5E. Thus, the wiring line 143a is contacted with and electrically connected to the collector contact region 116, through the corresponding contact hole 142a. The wiring line 143b is contacted with and electrically connected to the base connection region 118, through the corresponding contact hole 142b. The wiring line 143c is contacted with and electrically connected to the emitter electrode 123, through the corresponding contact hole 142c.

Thus, the semiconductor device is completed.

Like the first embodiment, the peak temperature during this gettering treatment is not limited to 850° C. It may be set at any value in the range from 700° C. to 850° C.

Although the npn-type bipolar transistor is formed at the main surface of the p-type silicon substrate 101 in the second embodiment using the SST, it may be formed at the main surface of an n-type single-crystal silicon substrate.

The method according to the second embodiment may be applied to a semiconductor device with an npn- or pnp-type bipolar transistor or the combination of a bipolar transistor and a MOSFET with the Bi-CMOS configuration.

If the Bi-CMOS configuration includes a MOSFET with a SALICIDE structure, it is preferred that the temperature of the gettering treatment is limited to the range of 700° C. to 800° C.

It is obvious that the fabrication method of a semiconductor device according to the second embodiment has the same advantages as those in the first embodiment.

Third Embodiment

FIGS. 6A to 6D show a fabrication method of a semiconductor device according to a third embodiment of the invention.

A gettering layer is provided in a silicon substrate in the first and second embodiments. However, in this third embodiment, a silicon substrate itself serves as a gettering site and a MOSFET is formed at an epitaxial layer located on the silicon substrate.

Figure 6A:
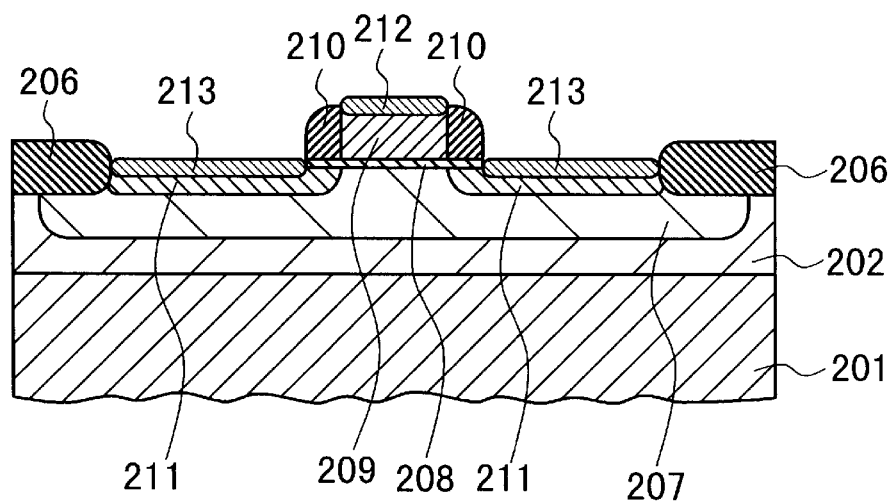
FIGS. 6A to 6D are partial cross-sectional views showing a fabrication method of a semiconductor device according to a third embodiment of the present invention, respectively.

First, a $p^+$-type single-crystal silicon substrate or wafer 201 is prepared, as shown in FIG. 6A. This substrate 201 has a doping concentration of $10^{18}$ to $10^{19}$ atoms/cm$^3$.

Although a lot of MOSFETs are formed on this substrate or wafer 201, only one of the MOSFETs is shown here for the sake of simplification of description.

Next, a p-type single-crystal silicon epitaxial layer 202 with a thickness of 5 $\mu$m is formed on the main surface of the substrate 201, as shown in FIG. 6A. This p-type epitaxial layer 202 has a doping concentration in the order of $10^{15}$ atoms/cm$^3$, which is lower than the $p^+$-type silicon substrate 201. This allows the silicon substrate 201 to serve as a gettering site.

Then, a field oxide layer 206 is selectively formed on the main surface of the epitaxial layer 202 using a LOCOS method, defining an active region. Phosphorus (P) is selectively ion-implanted into the active region of the epitaxial layer 202 at an acceleration energy of 0.7 MeV with a dose of $5 \times 10^{13}$ atoms/cm$^2$ using the field oxide layer 206 as a mask. Then, the substrate 201 and the epitaxial layer 202 are subjected to an RTA process at a temperature of 1000° C. for 30 seconds, where the heating rate is 100° C./sec. Thus, an n-type well 207 is formed in the p-type epitaxial layer 202, as shown in FIG. 6A.

In the well 207 thus formed, a gate oxide layer 208 is selectively formed on the main surface of the epitaxial layer 202. A polysilicon gate electrode 209 is formed on the gate oxide layer 208. A SiO$_2$ layer (not shown) is then deposited over the whole substrate 201 to cover the gate electrode 209 by a CVD method, and is etched back, forming a pair of sidewall spacers 210 on the gate oxide layer 208 at each side of the gate electrode 209.

Subsequently, boron difluoride (BF$_2$) is selectively ion-implanted into the p-type epitaxial layer 202 at an acceleration energy of 30 keV with a dose of $2 \times 10^{15}$ atoms/cm$^2$ using the gate electrode 209 and the pair of sidewall spacers 210 as a mask. Then, the substrate 201 and the epitaxial layer 202 are subjected to an RTA process at a temperature of 950° C. for 10 seconds. Thus, a pair of $p^+$-type source/drain regions 211 are formed in the n-type well 207, as shown in FIG. 6A. The pair of source/drain regions 211 have a same depth ($X_j$) of approximately 0.1 $\mu$m from the main surface of the epitaxial layer 202.

Next, a titanium (Ti) film is formed to cover the whole surface of the epitaxial layer 202 by sputtering. The Ti film is then subjected to a first sintering treatment at 690° C., thereby forming in self-alignment titanium silicide (TiSi$_2$) films 212 and 213 with the C49-type structure on the surfaces of the gate electrode 209 and the pair of source/drain regions 211. After removing the unreacted Ti film, the TiSi$_2$ films 212 and 213 with the C49-type structure are then subjected to a second sintering treatment at 800° C., thereby converting their crystalline structure from the C49 type to the C54 type due to phase transition. The state at this stage is shown in FIG. 6A.

Figure 6B:
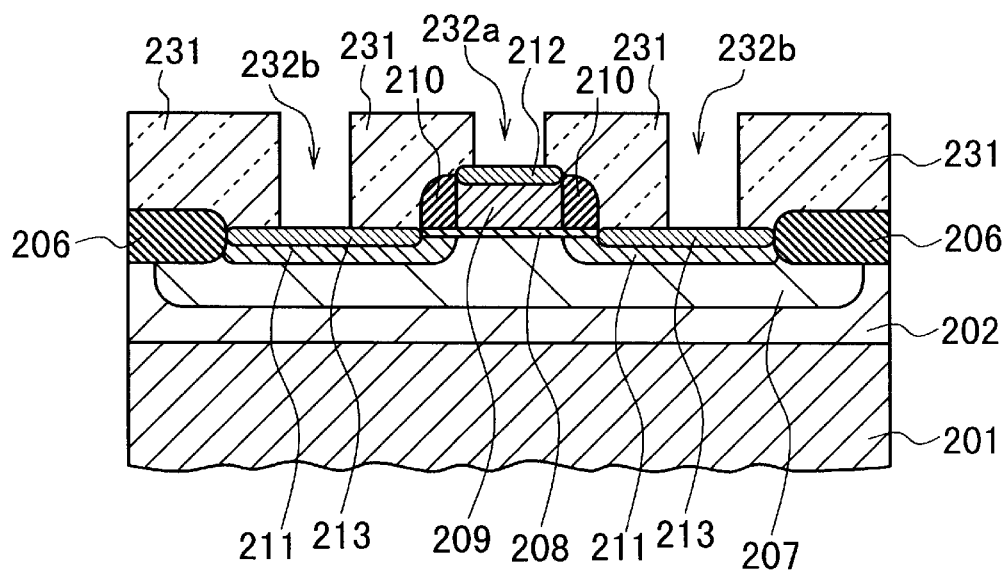
Figure 6C:
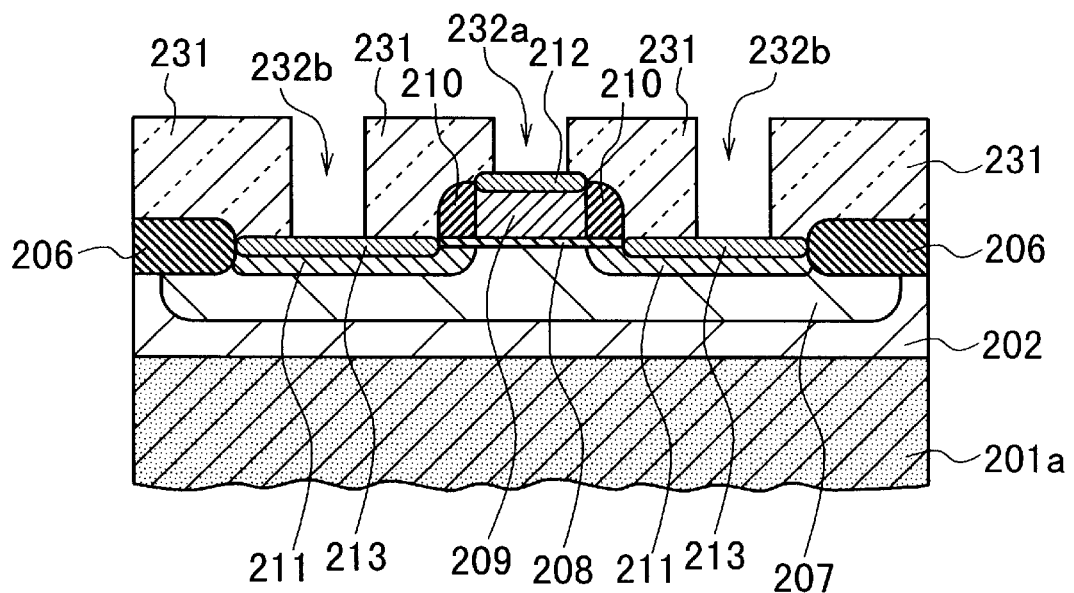

Following this, an interlayer dielectric layer 231 made of a SiO$_2$-system material is deposited to cover the gate electrode 208, the pair of sidewall spacers 210, the field oxide layer 206, and the uncovered surface of the well 207 over the whole substrate 201. A contact hole 232a reaching the top of the gate electrode 208 and a pair of contact holes 232b reaching the surfaces of the source/drain regions 211 are formed in the interlayer dielectric layer 231. The state at this stage is shown in FIG. 6B.

Further, using an RTA system, the substrate 201 with the above-described device structure formed thereon is rapidly heated up to 800° C. at a heating rate of 100° C./sec, and then, it is gradually cooled down to approximately 600° C. at a cooling rate of 30° C./min. Through this thermal process, a gettering treatment is performed. This gettering treatment has a temperature profile as shown in FIG. 7.

Figure 7:
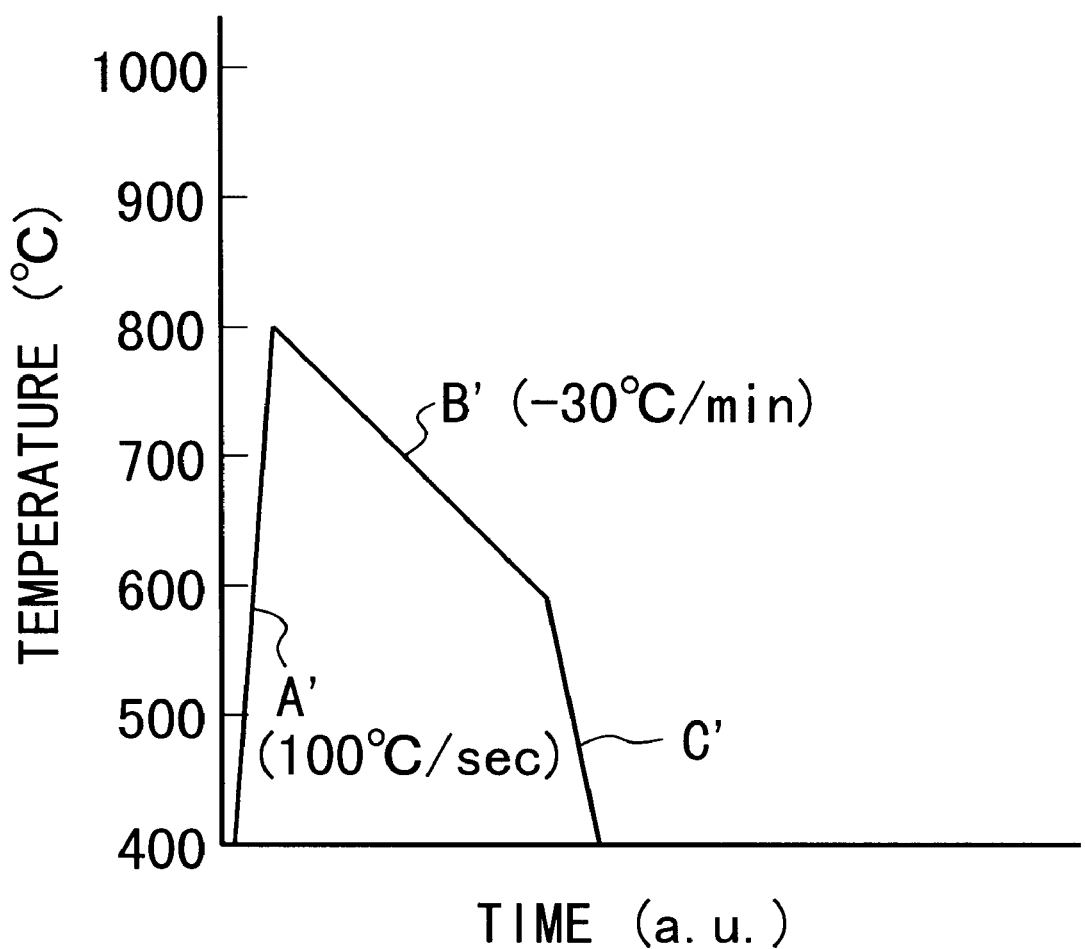
FIG. 7 is a graph showing the temperature change with respect to the time in the fabrication method of a semiconductor device according to the third embodiment of the present invention.

In FIG. 7, the line A' represents the rapid heating period, the line B' represents the gradual cooling period, and the line C' represents a native cooling period.

During this gettering treatment, metallic impurities existing in the interior of the p-type epitaxial layer 202 diffuse into the $p^+$-type silicon substrate 201, and they are effectively trapped by this substrate 201. The silicon substrate 201 in which the metallic impurities are trapped is illustrated as a symbol 201a in FIG. 6C.

No process at a higher temperature than 800° C. is performed later. Therefore, the trapped metallic impurities by the substrate 201 are difficult to be dissolved again.

Figure 6D:
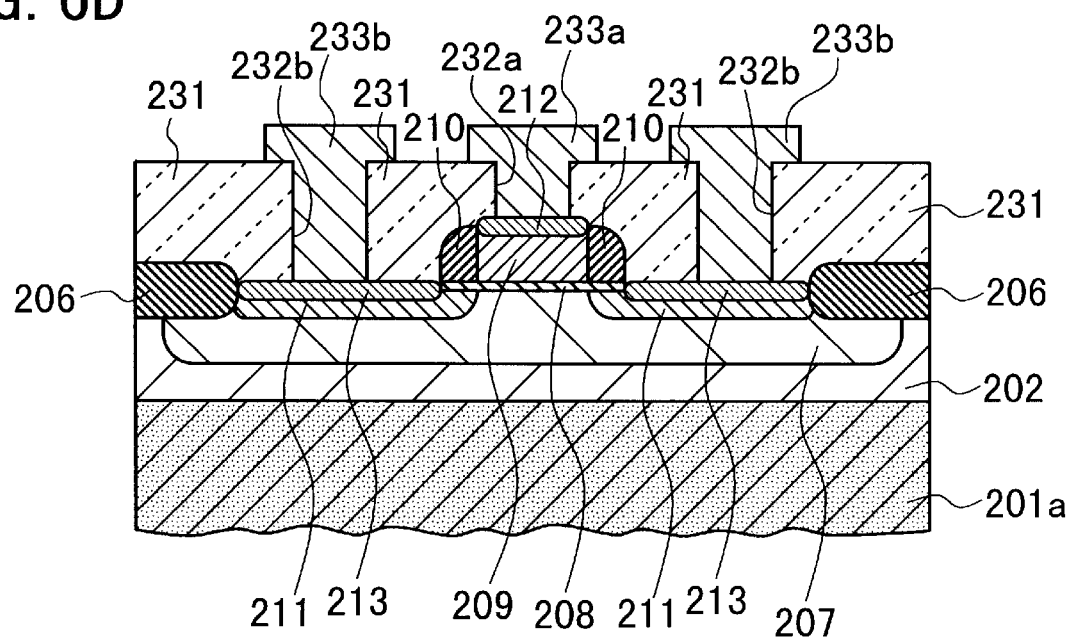

Finally, a metallic wiring line 233a for the gate electrode 208 and a pair of metallic wiring lines 233b for the source/drain regions 211 are formed on the interlayer dielectric layer 231, as shown in FIG. 6D. Thus, the wiring line 233a is contacted with and electrically connected to the gate electrode 209 through the corresponding contact hole 232a. The pair of wiring lines 233b are contacted with and electrically connected to the pair of source/drain regions 211 through the corresponding contact holes 232b, respectively.

Assuming that a target metallic element to be removed by the gettering process is Fe, the solid solubility of Fe is as high as approximately $6.0 \times 10^{12}$ cm$^{-3}$ at a temperature of 800° C. in the p-type epitaxial layer 202. Therefore, it is supposed that Fe atoms are stably dissolved in the interior of the p-type epitaxial layer 202 at the high temperature of 800° C.

Because the substrate 201 and the epitaxial layer 201 are promptly subjected to the subsequent cooling step without holding it at 800° C., it may be assumed that the effect by this gettering process is equivalent to that by a heat treatment at a constant temperature of 750° C. for 1.5 minutes. Under this assumption, the diffusion coefficient of Fe is calculated as $6 \times 10^{-7}$ cm$^2$/sec. Therefore, the Fe atoms will diffuse for a distance of approximately 0.151 mm, which is much longer than the thickness (i.e., 5 μm) of the epitaxial layer 201.

Therefore, the Fe atoms not only existing in the interior of the p-type epitaxial layer 202 but also those entered from the main surface of the epitaxial layer 202 are able to diffuse into the underlying $p^+$-type substrate 201, and they are readily trapped therein. Also, the p-n junction depth $X_j$ of the pair of source/drain regions 211 scarcely increases through this gettering treatment, and the aggregation of the $TiSi_2$ films 212 is avoided. Accordingly, the short-channel effects occurrence due to decrease of the effective channel length and the sheet resistance increase of the gate electrode 209 are able to be prevented. This means that the electric operation characteristics of the p-channel MOSFET with the SALICIDE structure is readily suppressed.

The peak temperature during this gettering treatment is not limited to 800° C. It may be set at any value in the range from 700° C. to 800° C.

Although the p-channel MOSFET is formed at the surface of the epitaxial layer 202 in the third embodiment, it may be applied to a semiconductor device with an n-channel MOSFET or Complementary MOSFETs if it has (or, they have) the SALICIDE structure.

If a MOSFET has no SALICIDE structure, the temperature of the gettering treatment may be set in the range of 700° C. to 850° C.

If an n-type collector region is formed in the n-type well 207, this method may be applied to an npn-type bipolar transistor.

It is obvious that the fabrication method of a semiconductor device according to the third embodiment has the same advantages as those in the first embodiment.

Fourth Embodiment

FIGS. 8A to 8E show a fabrication method of a semiconductor device according to a fourth embodiment of the present invention. In this fourth embodiment, an npn-type bipolar transistor is formed at a second epitaxial layer located on a first epitaxial layer using an SST, instead of a MOSFET in the third embodiment.

Figure 8A:
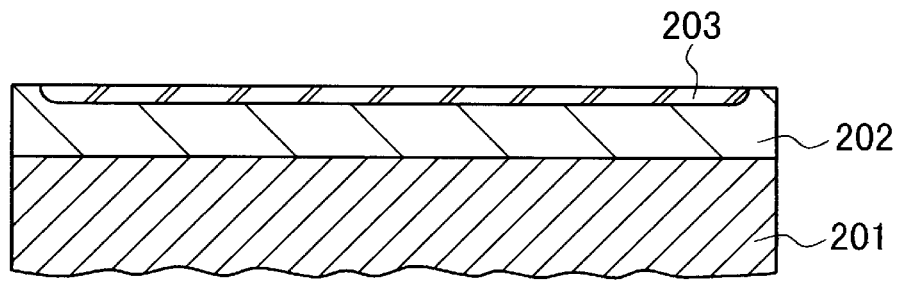
FIGS. 8A to 8E are partial cross-sectional views showing a fabrication method of a semiconductor device according to a fourth embodiment of the present invention, respectively.

First, a $p^+$-type single-crystal silicon substrate or wafer 201 is prepared, as shown in FIG. 8A. This substrate 201 has a doping concentration of $10^{18}$ to $10^{19}$ atoms/cm$^3$, which is lower than the $p^+$-type silicon substrate 201. This allows the silicon substrate 201 to serve as a gettering site.

Although a lot of bipolar transistors are formed on this substrate 201, only one of the transistors is shown here for the sake of simplification of description.

Next, a p-type single-crystal silicon epitaxial layer 202 with a thickness of 7 μm is formed on the main surface of the substrate 201, as shown in FIG. 8A. This epitaxial layer 202 has a doping concentration in the order of $10^{15}$ atoms/cm$^3$.

Phosphorus (P) is then ion-implanted into the p-type epitaxial layer 202 with a dose in the order of $1\times10^{16}$ atoms/cm$^2$, thereby forming an $n^+$-type buried layer 203 in the epitaxial layer 202, as shown in FIG. 8A.

Figure 8B:
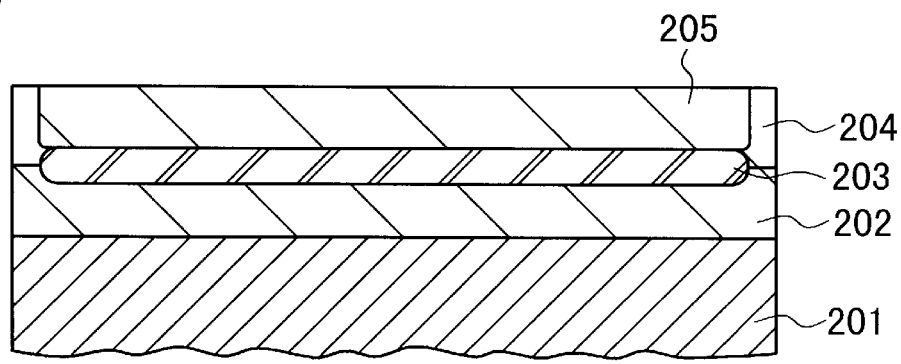

Subsequently, another p-type single-crystal silicon epitaxial layer 204 with a thickness of approximately 3 μm is formed on the main surface of the p-type epitaxial layer 204, as shown in FIG. 8B. This epitaxial layer 204 has a doping concentration in the order of $10^{15}$ atoms/cm$^3$, which is lower than the $p^+$-type silicon substrate 201. This allows the silicon substrate 201 to serve as the gettering site.

During this epitaxial growth process, the dopant impurity existing in the $n^+$-type buried layer 203 is redistributed and the top of the layer 203 is slightly raised from its initial level into the p-type epitaxial layer 204.

Further, phosphorus (P) is ion-implanted into the p-type upper epitaxial layer 204 with a dose in the order of $5\times10^{13}$ atoms/cm$^2$, thereby forming an n-type collector layer 205 in the epitaxial layer 204, as shown in FIG. 8B. The bottom of the n-type collector layer 205 is contacted with the top of the underlying $n^+$-type buried layer 203.

Then, a field oxide layer 206 is selectively formed on the main surface of the p-type epitaxial layer 204 using a LOCOS method, defining an active region to include the collector region 205.

Further, a first $SiO_2$ layer 215 with a thickness of several tens nanometers is formed on the uncovered area of the main surface of the p-type epitaxial layer 204 by thermal oxidation. Phosphorus is selectively ion-implanted into the p-type epitaxial layer 204 using a patterned photoresist film (not shown) as a mask, thereby forming an $n^+$-type collector contact region 216. This $n^+$-type collector contact region 216 is contacted with and electrically connected to the n-type collector region 205. The $n^+$-type collector contact region 216 is electrically connected to the $n^+$-type buried layer 203 through the n-type collector region 205.

The first $SiO_2$ layer 215 is selectively removed at a predetermined base-formation area, thereby forming a base window in the layer 215. Then, boron difluoride ($BF_2$) is ion-implanted into the p-type epitaxial layer 204 through this window at an acceleration energy of 30 keV with a dose of $1\times10^{14}$ atoms/cm$^2$, thereby forming a p-type base region 217 in the collector region 205. A $p^+$-type polysilicon layer (not shown) and a second $SiO_2$ layer 219 are successively deposited to cover the whole main surface of the substrate 201 by a CVD method. The polysilicon layer and the second $SiO_2$ layer 219 are successively patterned by anisotropic etching. Thus, a base contact region 218 is formed by the remaining polysilicon layer while remaining the second $SiO_2$ layer 219 on the base connection region 218.

Further, a third $SiO_2$ layer (not shown) with a thickness of 150 nm is deposited to cover the whole main surface of the substrate 201 by a CVD method. The third $SiO_2$ layer is etched back by anisotropic etching, thereby forming a pair of sidewall spacers 220 at the inside and outside of the base connection region 218. The pair of sidewall spacers 220 cover the inside and outside of the remaining second $SiO_2$ layer 219 also.

An undoped polysilicon layer with a thickness of 200 nm is then formed to cover the whole main surface of the epitaxial layer 204. Arsenic is ion-implanted into the undoped polysilicon layer thus formed at an acceleration energy of 70 keV with a dose of $1\times10^{16}$ atoms/cm$^2$. The arsenic-implanted polysilicon layer is then patterned to a predetermined shape of an emitter electrode. The patterned polysilicon layer is subjected to an RTA process at 1000° C. for 10 seconds. Thus, the conductivity of the patterned polysilicon layer is turned to the $n^+$-type, resulting in an $n^+$-type emitter electrode 223.

At the same time, the boron doped into the base contact region 218 is thermally diffused into the upper epitaxial layer 204, thereby forming a $p^+$-type graft base region 221. The phosphorus doped into the emitter electrode 223 is thermally diffused into the upper epitaxial layer 204, thereby forming an $n^+$-type emitter region 222. The $p^+$-type graft base region 221 has a p-n junction depth of approximately 100 nm. The $n^+$-type emitter region 222 has a p-n junction depth of approximately 50 nm.

Figure 8C:
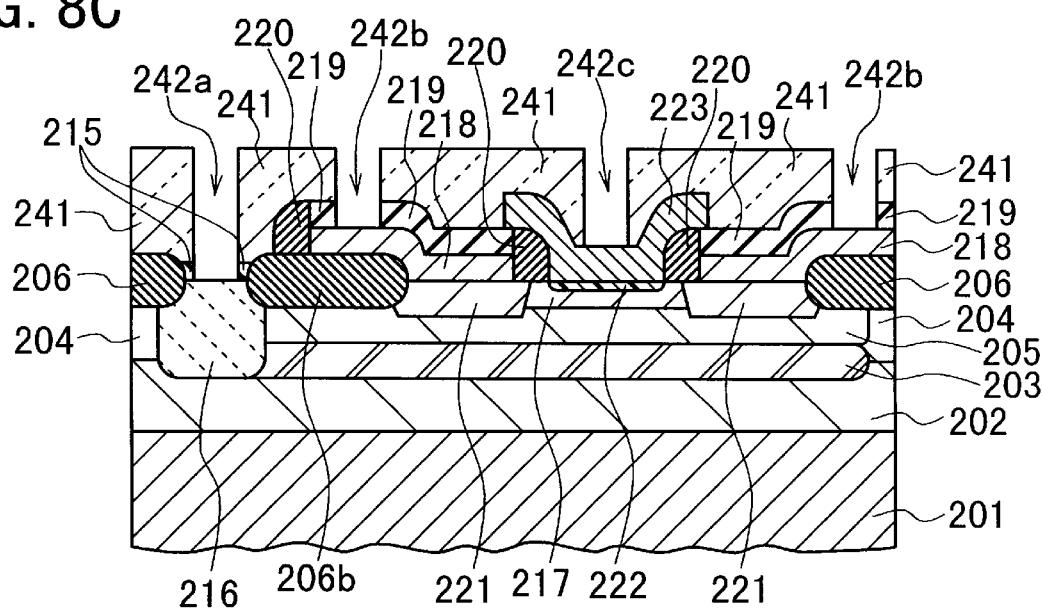
Figure 8D:
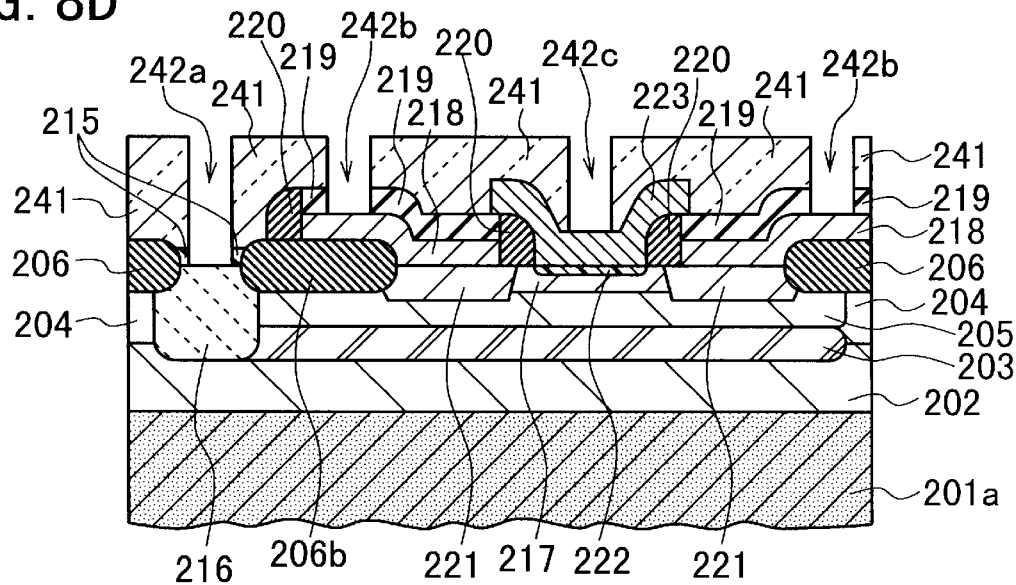

Following this step, an interlayer dielectric layer 241 made of a $SiO_2$-system material is deposited to cover the whole main surface of the epitaxial layer 204. A contact hole 242a reaching the top of the collector contact region 216, a contact hole 242b reaching the top of the base contact region 219, a contact hole 242c reaching the top of the emitter electrode 223 are formed in the interlayer dielectric layer 241. The state at this stage is shown in FIG. 8C. The contact hole 242a penetrates the interlayer dielectric layer 241 and the SiO$_2$ layer 215. The contact holes 242b and 242c penetrate the interlayer dielectric layer 241 alone.

Further, using an RTA system, the substrate 201 with the above-described device structure formed thereon is rapidly heated up to 850° C. at a heating rate of 100° C./sec, and then, it is gradually cooled down to approximately 600° C. at a cooling rate of 10° C./min. Through this thermal process, a gettering treatment is performed. This gettering treatment has the same temperature profile as shown in FIG. 7.

During this gettering treatment, metallic impurities existing in the interior of the p-type silicon epitaxial layers 202 and 204 are effectively trapped by the p$^+$-type substrate 201. In other words, the substrate 201 serves as a gettering site. The substrate 201 in which the metallic impurities are trapped is illustrated as a symbol 201a in FIG. 8D.

No subsequent process at a higher temperature than 850° C. is performed later. Therefore, the trapped metallic impurities by the p$^+$-type substrate 201 are difficult to be dissolved again. Also, because the junction depth ($X_j$) of the p$^+$-type graft base region 221 scarcely increases during this gettering treatment, leakage current between the p$^+$-type graft base region 221 and the n$^+$-type emitter region 222 is effectively and readily suppressed.

Figure 8E:
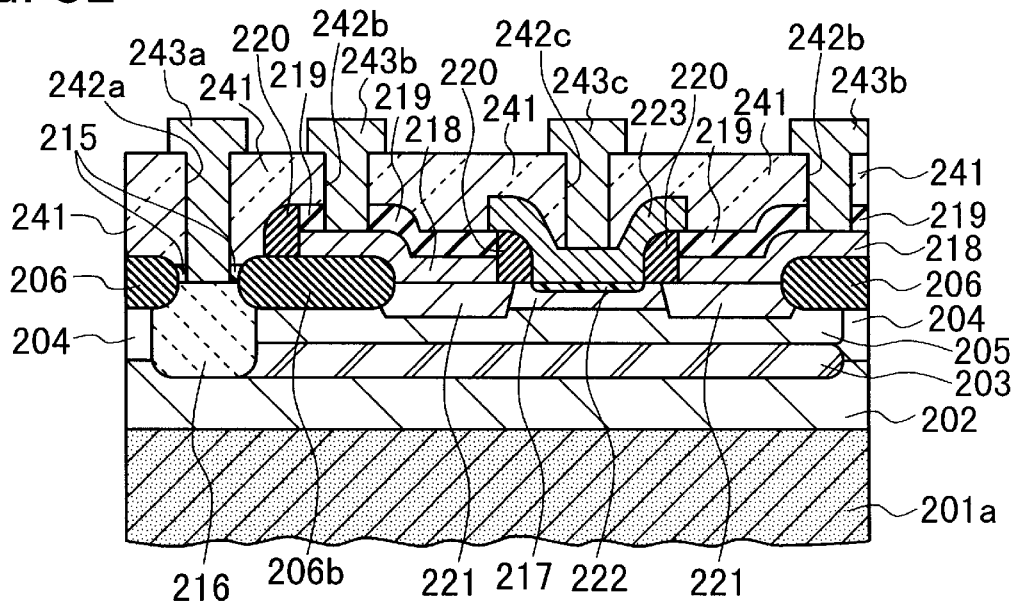

Finally, a metallic wiring line 243a for the n$^+$-type collector contact region 216, a metallic wiring line 243b for the base connection region 218, and a metallic wiring line 243c for the emitter electrode 223 are formed on the interlayer dielectric layer 241, as shown in FIG. 8E. Thus, the wiring line 243a is contacted with and electrically connected to the collector contact region 216 through the corresponding contact hole 242a. The wiring line 243b is contacted with and electrically connected to the base connection region 218, through the corresponding contact hole 242b. The wiring line 243c is contacted with and electrically connected to the emitter electrode 223 through the corresponding contact hole 242c.

Thus, the semiconductor device is completed.

The distance between the main surface of the epitaxial layer 206 and that of the substrate 201 is 10 μm. On the other hand, Fe atoms will diffuse for a distance of approximately 0.151 mm during the above gettering-treatment process, which is longer than this distance of 10 μm. Therefore, not only Fe atoms existing in the epitaxial layers 202 and 204 but also those entered from the main surface of the upper epitaxial layer 204 are able to diffuse into the substrate 401, and they are trapped therein.

Also, the p-n junction depth $X_j$ of the graft base region 221 scarcely increases through this gettering treatment. Accordingly, degradation of the electrical operation characteristics of the bipolar transistor is readily suppressed.

The peak temperature during this gettering treatment is not limited to 850° C. It may be set at any value in the range from 700° C. to 850° C.

Although the npn-type bipolar transistor is formed at the surface of the p-type epitaxial layer 204 in the fourth embodiment using the SST, the method according to the fourth embodiment may be applied to a semiconductor device with an npn- or pnp-type bipolar transistor or the combination of a bipolar transistor and a MOSFET with the Bi-CMOS configuration.

If the Bi-CMOS configuration includes a MOSFET with a SALICIDE structure, it is preferred that the temperature of the gettering treatment is limited to the range of 700° C. to 800° C.

It is obvious that the fabrication method of a semiconductor device according to the fourth embodiment has the same advantages as those in the first embodiment.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A fabrication method of a semiconductor device, comprising the steps of:
    (a) preparing a single-crystal silicon substrate having a gettering layer in its interior;
    said the gettering layer being located at a specific depth from a main surface of said substrate;
    (b) forming transistors at said main surface of said substrate;
    (c) forming an interlayer dielectric layer to cover said transistors;
    (d) forming contact holes in said interlayer dielectric layer to uncover specific positions of said respective transistors;
    (e) rapidly heating said substrate to a first temperature of 700° C. to 850° C. at a heating rate after said step (d);
    (f) gradually cooling said substrate from said first temperature to a second temperature of approximately 600° C. at a cooling rate;
    said cooling step (f) being promptly started without holding said substrate at said first temperature; and
    (g) forming metallic wiring lines on said interlayer dielectric layer to be electrically connected to said respective transistors through said corresponding contact holes after said step (f);
    wherein said depth of said gettering layer is less than a diffusible distance of a target metallic impurity during said step (f), allowing said target metallic impurity to diffuse into said gettering layer;
    and wherein said target metallic impurity existing in and entered into said interior of said substrate is trapped by said gettering layer during said step (f).

2. A method as claimed in claim 1, wherein said transistors include at least one MOSFET with a SALICIDE structure;
    and wherein said first temperature in said step (e) is in a range from 700° C. to 800° C.

3. A method as claimed in claim 1, wherein said heating rate in said step (e) is 50° C./sec or higher.

4. A method as claimed in claim 1, wherein said cooling rate in said step (f) is in a range from 1° C./min to 100° C./min.

5. A method as claimed in claim 1, wherein said cooling rate in said step (f) is in a range from 3° C./min to 10° C./min.

6. A method as claimed in claim 1, wherein said substrate and said gettering layer are of a p-type;
    and wherein said gettering layer is higher in doping concentration than said remaining substrate.

7. A fabrication method of a semiconductor device, comprising the steps of:
    (a) forming a first single-crystal silicon epitaxial layer on or over a main surface of a p-type single-crystal silicon substrate;
    (b) forming transistors at a main surface of said first epitaxial layer;
    (c) forming an interlayer dielectric layer to cover said transistors;

(d) forming contact holes in said interlayer dielectric layer to uncover specific positions of said respective transistors;

(e) rapidly heating said substrate and said first epitaxial layer to a first temperature of 700° C. to 850° C. at a heating rate after said step (d);

(f) gradually cooling said substrate and said first epitaxial layer from said first temperature to a second temperature of approximately 600° C. at a cooling rate;

said cooling step (f) being promptly started without holding said substrate and said first epitaxial layer at said first temperature; and (g) forming metallic wiring lines on said interlayer dielectric layer to electrically connected to said respective transistors through said corresponding contact holes after said step (f);

wherein said distance from said main surface of said first epitaxial layer to said main surface of said substrate is less than a diffusible distance of a target metallic impurity during said step (f), allowing said target metallic impurity to diffuse into said substrate;

and wherein said target metallic impurity existing in and entered into said interior of said first epitaxial layer is trapped by said substrate during said step (f).

8. A method as claimed in claim 7, wherein said transistors include at least one MOSFET with a SALICIDE structure;

and wherein said first temperature in said step (e) is in a range from 700° C. to 800° C.

9. A method as claimed in claim 7, wherein said heating rate in said step (e) is 50° C./sec or higher.

10. A method as claimed in claim 7, wherein said cooling rate in said step (f) is in a range from 1° C./min to 100° C./min.

11. A method as claimed in claim 7, wherein said cooling rate in said step (f) is in a range from 3° C./min to 10° C./min.

12. A method as claimed in claim 7, wherein said first epitaxial layer and said substrate are of a p-type;

and wherein said substrate is higher in doping concentration than said first epitaxial layer.

13. A method as claimed in claim 7, further comprising a step (h) of forming a second single-crystal silicon epitaxial layer between said steps (a) and (b);

wherein said second epitaxial layer is located on said main surface of said substrate, and said first epitaxial layer is located on said second epitaxial layer.

* * * * *